United States Patent
Lu

(10) Patent No.: US 9,490,424 B2
(45) Date of Patent: Nov. 8, 2016

(54) SUB-LITHOGRAPHIC PATTERNING OF MAGNETIC TUNNELING JUNCTION DEVICES

(71) Applicant: QUALCOMM INCORPORATED, San Diego, CA (US)

(72) Inventor: Yu Lu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/149,004

(22) Filed: May 6, 2016

(65) Prior Publication Data
US 2016/0254446 A1 Sep. 1, 2016

Related U.S. Application Data

(62) Division of application No. 14/483,919, filed on Sep. 11, 2014, now Pat. No. 9,362,336.

(51) Int. Cl.
| | |
|---|---|
| *H01L 43/00* | (2006.01) |
| *H01L 43/12* | (2006.01) |
| *H01L 27/22* | (2006.01) |
| *H01L 43/02* | (2006.01) |
| *H01L 43/08* | (2006.01) |
| *G11C 11/16* | (2006.01) |
| *H01L 43/10* | (2006.01) |

(52) U.S. Cl.
CPC .............. *H01L 43/12* (2013.01); *G11C 11/16* (2013.01); *G11C 11/161* (2013.01); *G11C 11/1673* (2013.01); *G11C 11/1675* (2013.01); *H01L 27/222* (2013.01); *H01L 27/228* (2013.01); *H01L 43/02* (2013.01); *H01L 43/08* (2013.01); *H01L 43/10* (2013.01)

(58) Field of Classification Search
CPC ............................... H01L 43/12; G11C 11/19
USPC ..................................................... 257/421, 4
IPC ................................. H01L 43/12; G11C 11/19
See application file for complete search history.

(56) References Cited

U.S. PATENT DOCUMENTS

| | | | |
|---|---|---|---|
| 7,485,487 B1 * | 2/2009 | Breitwisch | ............. H01L 45/06 257/3 |
| 7,696,551 B2 | 4/2010 | Xiao et al. | |
| 7,863,060 B2 | 1/2011 | Belen et al. | |
| 8,283,650 B2 * | 10/2012 | Breitwisch | .......... H01L 27/2436 257/4 |
| 8,542,526 B2 | 9/2013 | Keshtbod et al. | |

(Continued)

OTHER PUBLICATIONS

International Search Report and Written Opinion—PCT/US2015/040961—ISA/EPO—Sep. 29, 2015.

(Continued)

*Primary Examiner* — Dung Le
(74) *Attorney, Agent, or Firm* — Seyfarth Shaw LLP

(57) ABSTRACT

A method for fabricating a magnetic tunnel junction (MTJ) device includes creating a recess within a second patterning layer, in which a first patterning layer overhangs the recessed second patterning layer. Such a method further includes depositing a film into the recess to create a keyhole pattern within the deposited film. The method further includes transferring the keyhole pattern through a hard mask layer to an MTJ stack. The method also includes depositing a conductive material into the transferred keyhole pattern and on an MTJ stack. The method also includes removing the hard mask layer to create a conductive hard mask pillar.

16 Claims, 13 Drawing Sheets

(56) References Cited

U.S. PATENT DOCUMENTS

| | | |
|---|---|---|
| 8,590,139 B2 | 11/2013 | Op De Beeck et al. |
| 8,975,089 B1 | 3/2015 | Jung et al. |
| 2007/0020934 A1 | 1/2007 | Gaidis et al. |
| 2010/0097846 A1 | 4/2010 | Sugiura et al. |
| 2010/0276768 A1 | 11/2010 | Gaidis |
| 2011/0108292 A1* | 5/2011 | Moyer ............ A62C 4/00 169/48 |
| 2011/0272380 A1 | 11/2011 | Jeong et al. |
| 2013/0015540 A1 | 1/2013 | Choi |
| 2014/0042567 A1 | 2/2014 | Jung et al. |
| 2014/0124883 A1 | 5/2014 | Iwayama |
| 2014/0167191 A1 | 6/2014 | Doyle et al. |
| 2015/0287910 A1 | 10/2015 | Lu et al. |
| 2016/0079307 A1 | 3/2016 | Lu |

OTHER PUBLICATIONS

Raoux S., et al., "Phase-change random access memory: A scalable technology", IBM Journal of Research and Development, vol. 52, No. 4/5, Jul./Sep. 2008, pp. 465-479.

* cited by examiner

SUB-LITHOGRAPHIC PATTERNING OF MAGNETIC TUNNELING JUNCTION DEVICES

CROSS-REFERENCE TO RELATED APPLICATION

The present application is a divisional of U.S. patent application Ser. No. 14/483,919, filed on Sep. 11, 2014, and entitled "SUB-LITHOGRAPHIC PATTERNING OF MAGNETIC TUNNELING JUNCTION DEVICES," the disclosure of which is expressly incorporated by reference herein in its entirety.

BACKGROUND

Field

Certain aspects of the present disclosure generally relate to magnetic tunneling junction (MTJ) devices, and more particularly to sub-lithographic patterning of MTJ devices.

Background

Unlike conventional random access memory (RAM) chip technologies, in magnetic RAM (MRAM) data is stored by magnetization of storage elements. The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional STT-MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin-transfer-torque magnetic random access memory (STT-MRAM) is an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

Magnetic structures, such as magnetic tunneling junction (MTJ) structures, provide denser memory storage. The access transistor for magnetic random access memory (MRAM) structures, however, usually dominates the cell area of the memory. As such, the MRAM density is limited based on the access transistors rather than the memory storage, which limits the scaling of MRAM structures to smaller geometries.

SUMMARY

A method for fabricating a magnetic tunnel junction (MTJ) device includes creating a recess within a second patterning layer, in which a first patterning layer overhangs the recessed second patterning layer. Such a method further includes depositing a film into the recess to create a keyhole pattern within the deposited film. The method further includes transferring the keyhole pattern through a hard mask layer to an MTJ stack. The method also includes depositing a conductive material into the transferred keyhole pattern and on an MTJ stack. The method also includes removing the hard mask layer to create a conductive hard mask pillar.

A magnetic tunnel junction (MTJ) array includes MTJ stacks. The array further includes conductive hard mask pillars electrically coupled to corresponding ones of the MTJ stacks. The conductive hard mask pillars include an interface with the MTJ stack that has a smaller cross section than a cross section of a central region of the conductive hard mask pillars.

A magnetic tunnel junction (MTJ) array includes MTJ stacks. Such an array includes means for conducting. The conducting means is electrically coupled to a corresponding one of the MTJ stacks. The conducting means includes an interface with the corresponding one of the MTJ stacks that has a smaller cross section than a cross section of a central region of the corresponding one of the MTJ stacks.

A computer program product for fabricating magnetic tunnel junction (MTJ) array includes MTJ stacks may include a non-transitory computer readable medium having program code. The program code includes program code to create a recess within a second patterning layer. A first patterning layer may overhang the recessed second patterning layer. The program code also includes program code to depositing a film into the recess to create a keyhole pattern within the deposited film. The program code also includes program code to transfer the keyhole pattern through a hard mask layer to an MTJ stack. The program code further includes program code to deposit a conductive material into the transferred keyhole pattern and on an MTJ stack. The program code also includes program code to remove the hard mask layer to create a conductive hard mask pillar.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

MRAM is a non-volatile memory technology that uses magnetic elements. For example, spin transfer torque magnetoresistive random access memory (STT-MRAM) uses electrons that become spin-polarized as the electrons pass through a thin film (spin filter). STT-MRAM is also known as spin transfer torque RAM (STT-RAM), spin torque transfer magnetization switching RAM (Spin-RAM), and spin momentum transfer (SMT-RAM). STT-MRAM is also an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

Figure 1:
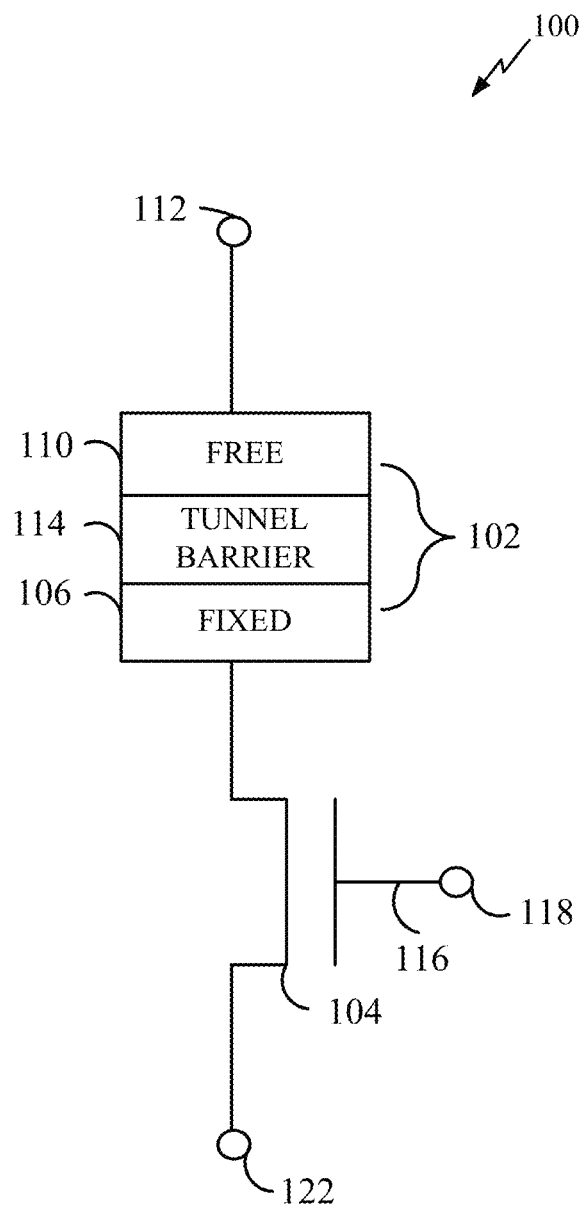
FIG. 1 is a diagram of a magnetic tunnel junction (MTJ) device connected to an access transistor.

FIG. 1 illustrates a memory cell 100 of a memory device including a magnetic tunnel junction (MTJ) 102 coupled to an access transistor 104. The memory device may be a magnetic random access memory (MRAM) device that is built from an array of individually addressable MTJs. An MTJ stack may include a free layer, a fixed layer and a tunnel barrier layer there between as well as one or more ferromagnetic layers. Representatively, a free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may form the fixed layer 106 and the free layer 110. For example, the fixed layer 106 may comprise multiple material layers including a cobalt-iron-boron (CoFeB) layer, a ruthenium (Ru) layer and a cobalt-iron (CoFe) layer. In addition, the free layer 110 may also include multiple material layers including a cobalt-iron-boron (CoFeB) layer, a ruthenium (Ru) layer and a cobalt-iron (CoFe) layer. Further, the tunnel barrier layer 114 may be magnesium oxide (MgO).

Figure 2:
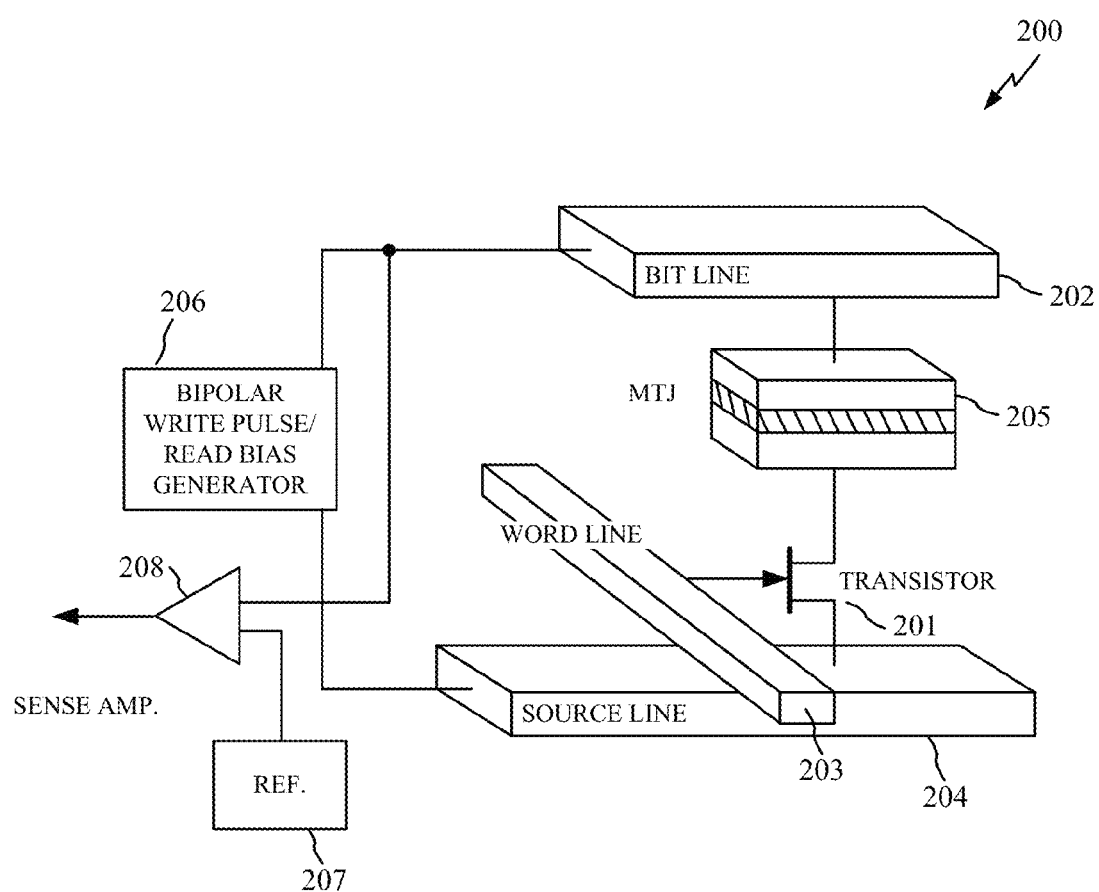
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 205, a transistor 201, a bit line 202 and a word line 203. The MTJ storage element 205 is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 also includes a source line 204, a sense amplifier 208, read/write circuitry 206 and a bit line reference 207.

Figure 3:
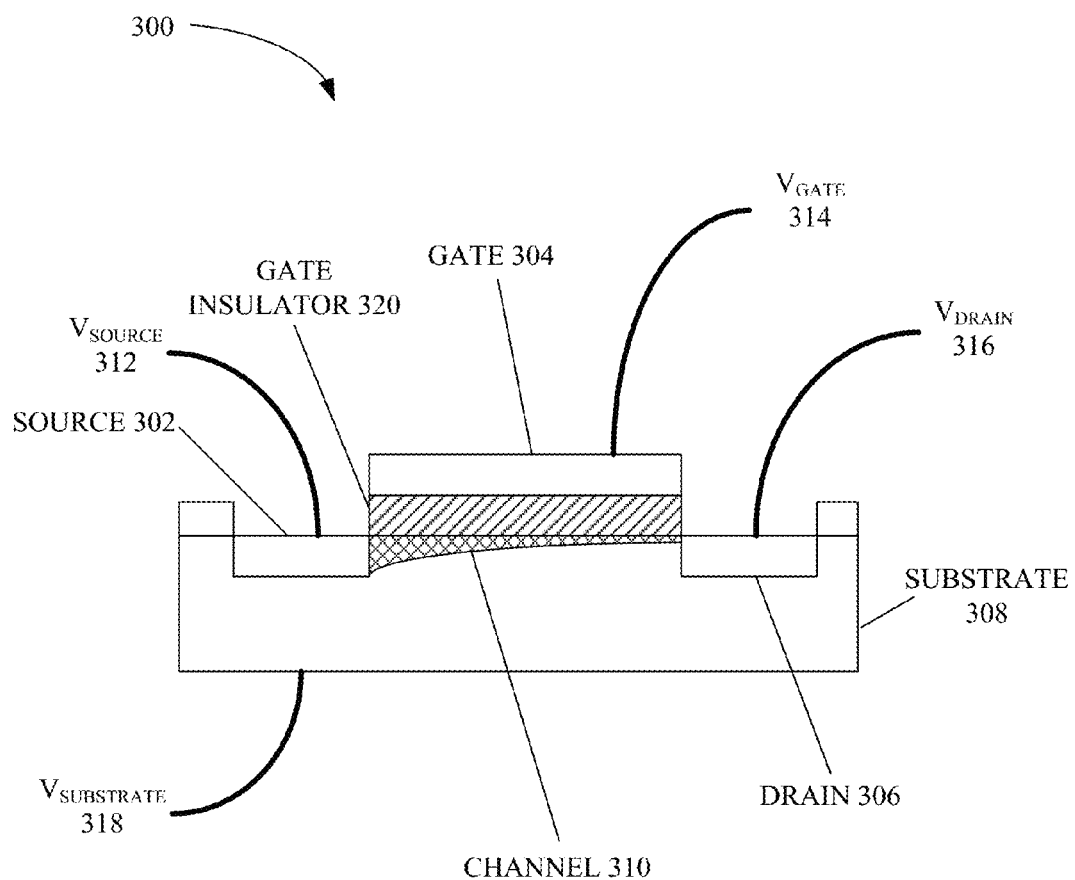
FIG. 3 illustrates a cross-sectional view of a metal-oxide-semiconductor field-effect transistor (MOSFET) device in an aspect of the present disclosure.
Figure 3:
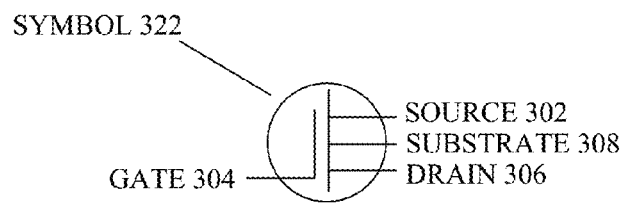

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells in the substrate 308, or may be fabricated as areas above the substrate 308, or as part of other layers on the die if desired. Such other structures may be a fin or other structure that protrudes from a surface of the substrate 308. Further, the substrate 308 may be the substrate on the die, but substrate 308 may also be one or more of the layers that are coupled to the substrate.

The MOSFET device 300 is a unipolar device, as electrical current is produced by only one type of charge carrier (e.g., either electrons or holes) depending on the type of the MOSFET device 300. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in aspects of the present disclosure.

To interconnect to the MOSFET device 300, or to interconnect to other devices in the die (e.g., semiconductor), interconnect traces or layers are used. These interconnect traces may be in one or more of layers of the MOSFET device 300.

Magnetic Random Access Memory

Materials that form a magnetic tunnel junction (MTJ) of a MRAM generally exhibit high tunneling magneto resistance (TMR), high perpendicular magnetic anisotropy (PMA) and good data retention. MTJ structures may be made in a perpendicular orientation, referred to as perpendicular, magnetic tunnel junction (pMTJ) devices. A stack of materials (e.g., cobalt-iron-boron (CoFeB) materials) with a dielectric barrier layer (e.g., magnesium oxide (MgO)) may be employed in a pMTJ structure. A pMTJ structure including a stack of materials (e.g., CoFeB/MgO/CoFeB) has been considered for MRAM structures.

Figure 4:
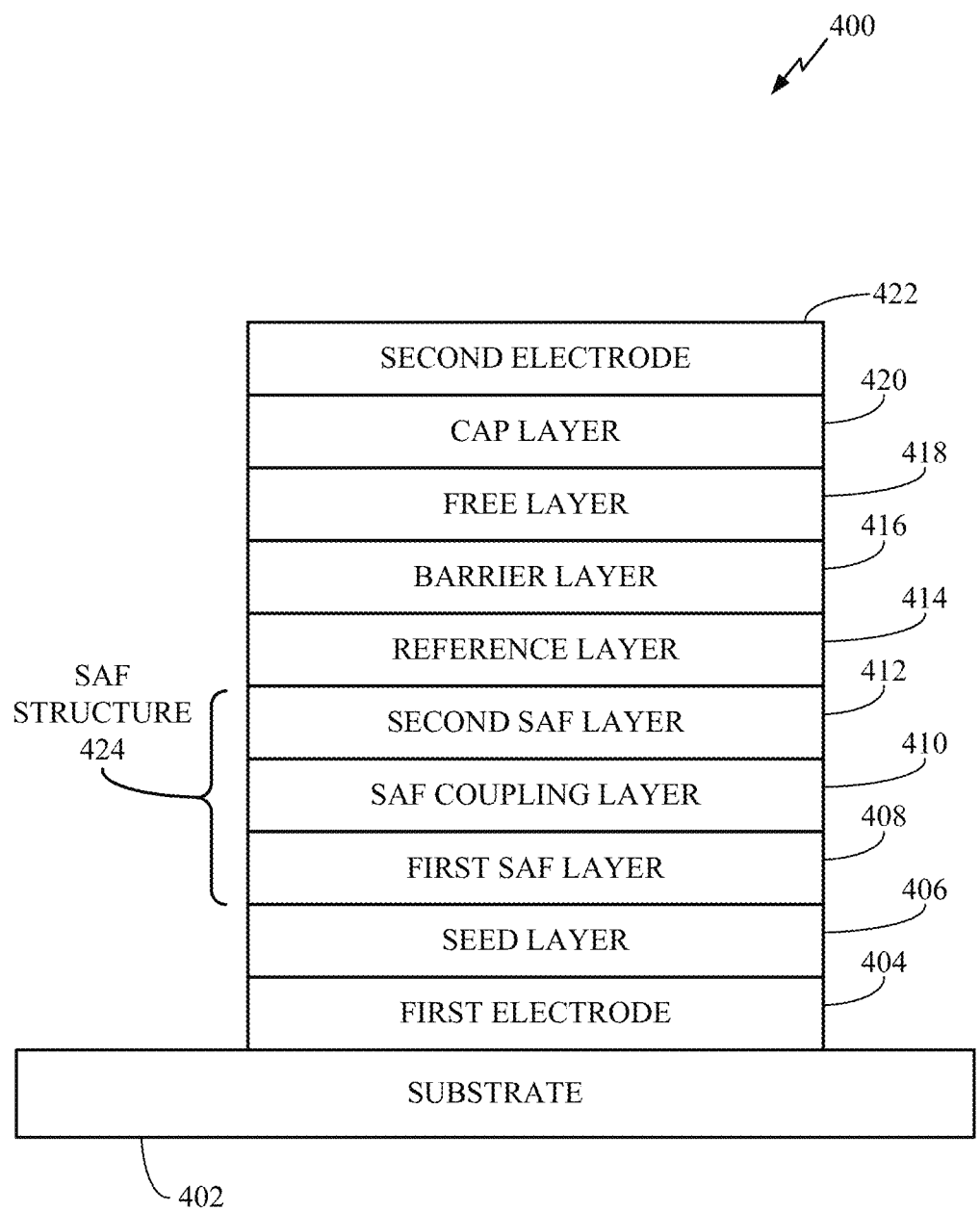
FIG. 4 illustrates a cross-sectional view of a perpendicular magnetic tunnel junction (pMTJ) structure in accordance with one aspect of the present disclosure.

FIG. 4 illustrates a cross-sectional view of a perpendicular magnetic tunnel junction (pMTJ) structure in accordance with one aspect of the present disclosure. Representatively, a MTJ structure 400, which is shown as a pMTJ structure in FIG. 4, is formed on a substrate 402. The MTJ structure 400 may be formed on a semiconductor substrate, such as silicon substrate, or any other alternative suitable substrate material. The MTJ structure 400 may include a first electrode 404, a seed layer 406, a first synthetic antiferromagnetic (SAF) layer 408, a SAF coupling layer 410, and a second SAF layer 412. The MTJ structure 400 also includes a reference layer 414, a barrier layer 416, a free layer 418, a cap layer 420 (also known as a capping layer), and a second electrode 422. The MTJ structure 400 may be a part of various types of devices, such as a semiconductor memory device (e.g., MRAM).

In this configuration, the first electrode 404 and the second electrode 422 include conductive materials (e.g., tantalum (Ta)). In other configurations, the first electrode 404 and/or second electrode 422 may include other appropriate materials, including but not limited to platinum (Pt), copper (Cu), gold (Au), aluminum (Al), or other like conductive materials. The first electrode 404 and the second electrode 422 may employ different materials within the MTJ structure 400.

A seed layer 406 is formed on the first electrode 404. The seed layer 406 may provide a mechanical and crystalline substrate for the first SAF layer 408. The seed layer 406 may be a compound material, including but not limited to, nickel chromium (NiCr), nickel iron (NiFe), NiFeCr, or other suitable materials for the seed layer 406. When the seed layer 406 is grown or otherwise coupled to the first electrode 404, a smooth and dense crystalline structure results in the seed layer 406. In this configuration, the seed layer 406 promotes growth of subsequently formed layers in the MTJ structure 400 according to a specific crystalline orientation. The crystalline structure of the seed layer 406 may be selected to be any crystal orientation within the Miller index notation system, but is often chosen to be in the (111) crystal orientation.

A first SAF layer 408 is formed on the seed layer 406. The first SAF layer 408 may be a single layer of material, or may be a multi-layer stack of materials, which is formed on the seed layer 406. The multi-layer stack of materials in the first SAF layer 408 may be a ferromagnetic material or a combination of materials to create a ferromagnetic moment in the first SAF layer 408. The multi-layer stack of materials forming the first SAF layer 408 includes, but are not limited to, cobalt (Co), cobalt in combination with other materials such as nickel (Ni), platinum (Pt), or palladium (Pd), or other like ferromagnetic materials.

An SAF coupling layer 410 is formed on the first SAF layer 408, and promotes magnetic coupling between the first SAF layer 408 and a second SAF layer 412. The SAF coupling layer 410 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 410 may also include materials to provide mechanical and/or crystalline structural support for the first SAF layer 408 and the second SAF layer 412.

The second SAF layer 412 is formed on the SAF coupling layer 410. The second SAF layer 412 may have similar materials as the first SAF layer 408, but may include other materials. The combination of the first SAF layer 408, the SAF coupling layer 410, and the second SAF layer 412 forms a SAF structure 424, which is often referred to as a "pinned layer" in the MTJ structure 400. The SAF structure 424 fixes, or pins, the magnetization direction of the SAF structure 424 through anti-ferromagnetic coupling. The SAF structure 424 may include a cobalt-iron-boron (CoFeB) film. The SAF structure 424 may also include other ferromagnetic material layers, such as CoFeTa, NiFe, Co, CoFe, CoPt, CoPd, FePt, or any alloy of Ni, Co and Fe.

A reference layer 414 is formed on the SAF structure 424. The reference layer 414 provides a crystalline orientation for the barrier layer 416. As with the seed layer 406, the material in the reference layer 414 provides a template for subsequent layers to be grown in a specific crystalline orientation. This orientation may be in any direction within the Miller index system, but is often in the (100) (or (001)) crystal orientation. The reference layer 414 may also be the last layer of the second SAF layer 412, but is shown as a separate layer for ease of explanation.

A barrier layer 416 (also referred to as a tunnel barrier layer) is formed on the reference layer 414. The barrier layer provides a tunnel barrier for electrons travelling between the SAF structure 424 and the free layer 418. The barrier layer 416, which may include magnesium oxide (MgO), is formed on the reference layer 414 and may have a crystalline structure. The crystalline structure of the barrier layer may be in the (100) direction. The barrier layer 416 may include other elements or other materials, such as aluminum oxide (AlO), aluminum nitride (AlN), aluminum oxynitride (AlON), or other non-magnetic or dielectric material. The thickness of the barrier layer 416 is formed such that electrons can tunnel from the SAF structure 424 through the barrier layer 416 to the free layer 418 when a biasing voltage is applied to the MTJ structure 400.

The free layer 418, which may be cobalt-iron-boron (CoFeB), is formed on the barrier layer 416. The free layer 418, when initially deposited on the barrier layer 416, is an amorphous structure. That is, the free layer 418 does not have a crystalline structure when initially deposited on the barrier layer 416. The free layer 418 is also a ferromagnetic layer or multilayer material, which may be the same ferromagnetic material as the SAF structure 424 or may include different materials.

In this configuration, the free layer 418 includes a ferromagnetic material that is not fixed or pinned in a specific magnetic orientation. The magnetization orientation of the free layer 418 is able to rotate to be in a parallel or an anti-parallel direction to the pinned magnetization of the SAF structure 424. A tunneling current flows perpendicularly through the barrier layer 416 depending upon the relative magnetization directions of the SAF structure 424 and the free layer 418.

A cap layer 420 is formed on the free layer 418. The cap layer 420 may be a dielectric layer, or other insulating layer, to allow containment of the magnetic and electric fields between the free layer 418 and the SAF structure 424. The cap layer 420 helps reduce the switching current density that switches the MTJ structure 400 from one orientation (e.g., parallel) to the other (e.g., anti-parallel). The cap layer 420, which may also be referred to as a capping layer, may be an oxide, such as, for example, amorphous aluminum oxide (AlOx) or amorphous hafnium oxide (HfOx). The cap layer 420 may also be other materials, such as magnesium oxide (MgO) or other dielectric materials without departing from the scope of the present disclosure.

The second electrode 422 is formed on the cap layer 420. In one configuration, the second electrode 422 includes tantalum. Alternatively, the second electrode 422 includes any other suitable conductive material for electrical connection of the MTJ structure 400 to other devices or portions of a circuit. Formation of the second electrode 422 on the cap layer 420 completes the MTJ structure 400.

Figure 5:
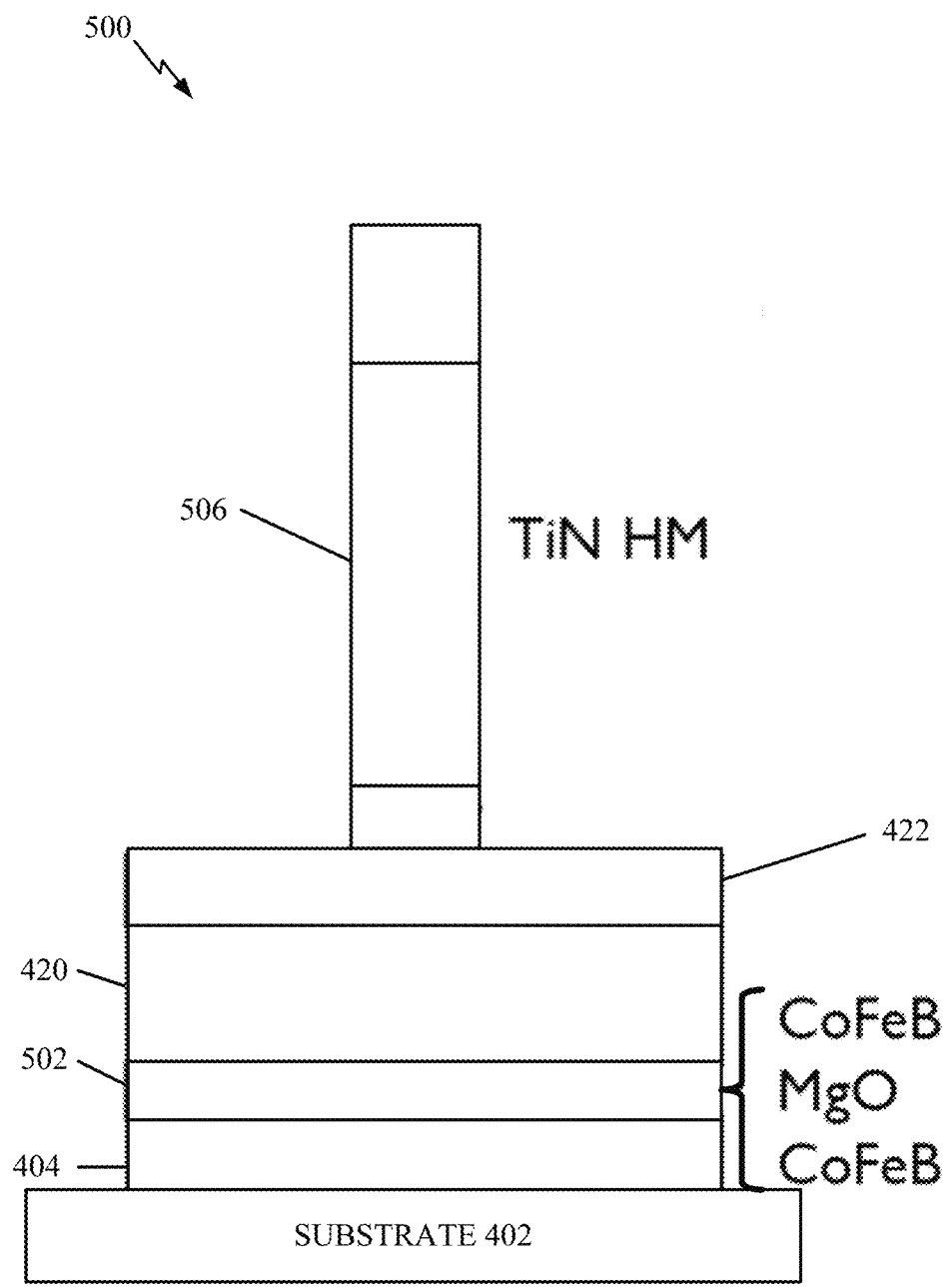
FIG. 5 illustrates an MTJ structure.

FIG. 5 illustrates an MTJ structure. To form individual ones of the MTJ devices 500, the substrate 402 supports the first electrode 404 (e.g., bottom electrode), and an MTJ stack 502 (structure), which may include the various layers (e.g., 406-418) as described in FIG. 4. The cap layer 420 and the second electrode 422 are shown in FIG. 5. The MTJ metal hard mask (MHM) pattern may be a pillar structure. The pillar structure height is based on the etch selectivity of the metal hard mask with respect to the MTJ structure 400 layers, and the presence of a top electrode on the metal hard mask for plasma chemistry/etching. This leads to high aspect ratio pillar structures (i.e., the height is greater than the width of the pillar). The pillar structures are difficult to pattern with high uniformity.

Such a pillar structure for manufacturing individual ones of the MTJ devices 500 includes a hard mask 506, which may be titanium nitride (TiN) or tantalum (Ta), and may have a thickness in the range of 30-200 nm. The pillar structure is employed as an etch mask to etch the second electrode 422, the cap layer 420, the MTJ stack 502, and the first electrode 404. The pillar structure is difficult to form with uniformity, which increases the cost of the MTJ overall. The materials and dimensions described are merely exemplary. Other materials and other layer thickness are also contemplated to be within the scope of the present disclosure.

The uniformity of the pillar structure, which may be referred to as the critical dimension (CD) uniformity, becomes more difficult to maintain as lithographic techniques strive for smaller and smaller device sizes. To reduce the size of the MTJ structure 400 and achieve adequate CD uniformity, a design may employ more advanced lithographic processes, multiple patterning of the layers producing the MTJ structure 400, or a very precise lithographic specification for the MTJ structure 400. Each of these approaches increases the cost of producing MTJ devices.

FIGS. 6-15 illustrate a process flow for forming a magnetic tunnel junction in accordance with an aspect of the present disclosure. One aspect of the present disclosure describes a damascene process that forms a "keyhole" structure. The keyhole structure may be a recess on an MTJ structure that is formed using a damascene process for precise formation of a pillar structure in which critical dimension (CD) uniformity is improved. In this aspect of the present disclosure, the formation of the keyhole structure enables a reduction in the size of the MTJ structure without increasing cost. The size reduction of the MTJ structure is cost effective because advanced lithographic processes, multiple patterning of the layers producing the MTJ structure, and/or precise lithographic specification for the MTJ structure are avoided.

Figure 6:
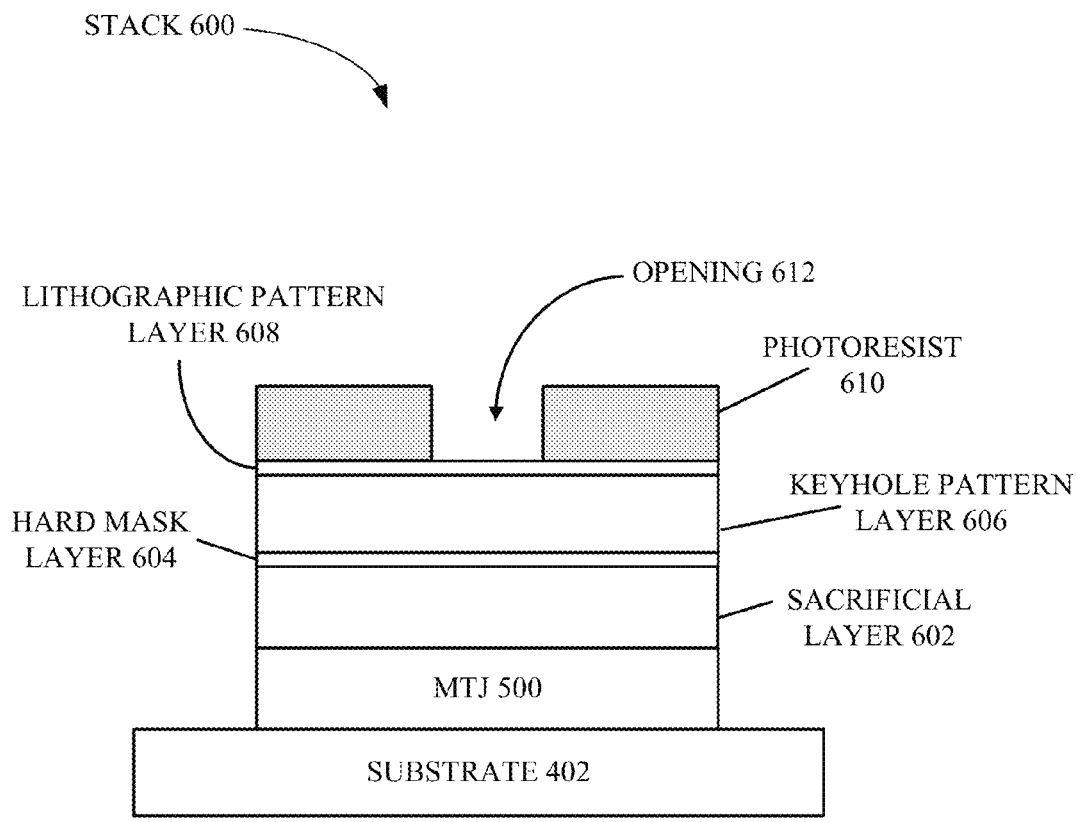
FIGS. 6-15 illustrate a process flow for forming a magnetic tunnel junction in accordance with an aspect of the present disclosure.

FIG. 6 illustrates a patterning stack 600 that includes a sacrificial layer 602, a hard mask layer 604, a keyhole pattern layer 606, and a lithographic pattern layer 608. The sacrificial layer 602 and the hard mask layer 604 may be combined into a single layer. Further, the sacrificial layer 602 is an optional layer in the patterning stack 600. The sacrificial layer 602 may be silicon dioxide, the hard mask layer 604 may be silicon nitride or a dielectric material, the keyhole pattern layer 606 may be silicon dioxide, and the lithographic pattern layer 608 may be silicon nitride. Other materials may be employed for layers without departing from the scope of the present disclosure. Photoresist 610 is also deposited on the lithographic pattern layer 608 and patterned with an opening 612. Although only the opening 612 is shown, multiple ones of the opening 612 may be employed within the scope of the present disclosure. The use of multiple ones of the opening 612 creates more than one MTJ structure.

Figure 7:
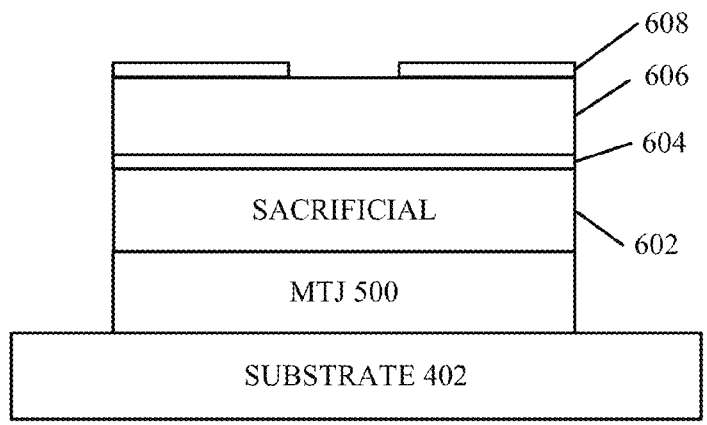

FIG. 7 illustrates transferring the opening 612 into the lithographic pattern layer 608 to expose the keyhole pattern layer 606. The transfer of the opening 612 may occur through wet or dry etch chemistry as desired.

Figure 8:
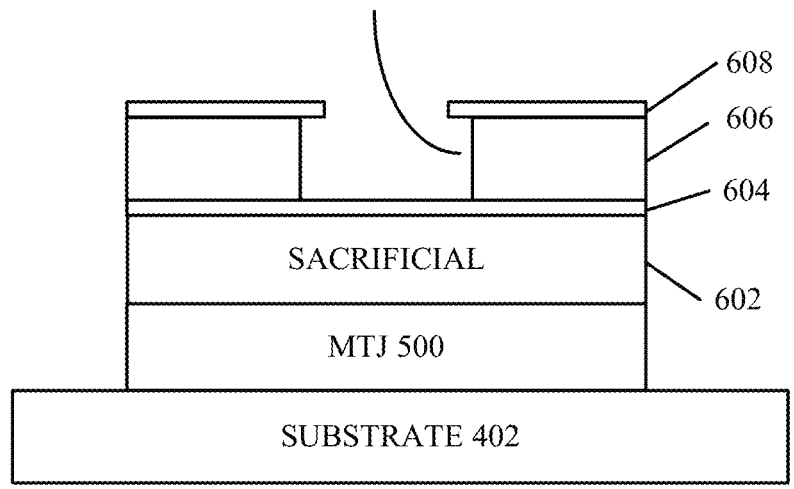

FIG. 8 illustrates etching the keyhole pattern layer 606 including a recess 614 using the lithographic pattern layer 608 as a mask. In an aspect of the present disclosure, the keyhole pattern layer 606 is "undercut" or recessed from the lithographic pattern layer 608. The undercutting of the keyhole pattern layer 606 may be performed using a selective isotropic etch, which may be a wet chemical etch, a high-pressure/low-bias plasma etch, or other isotropic etching process.

Figure 9:
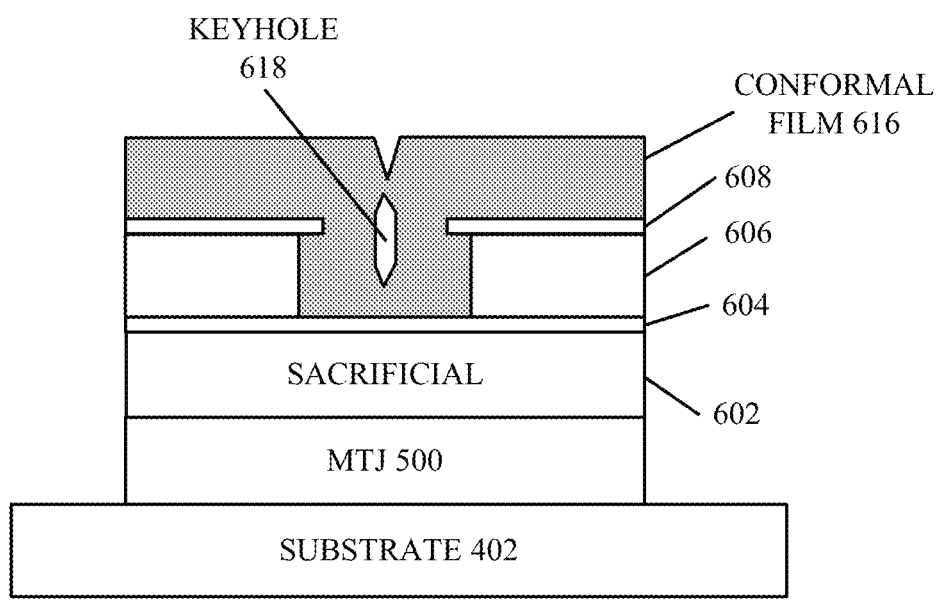

FIG. 9 illustrates depositing a conformal film 616 into the opening 612 including the recess 614. The conformal film 616 may be amorphous silicon, or other materials. Depositing the conformal film 616 into the opening 612 and the recess 614 forms a keyhole 618. The size of the keyhole is primarily determined by how far the keyhole pattern layer 606 is recessed from the lithographic pattern layer 608, and is primarily independent from the size of opening 612 in FIG. 6. For example, and not by way of limitation, if the recess 614 distance (depth) is fifteen (15) nanometers, the size (width) of the keyhole 618 is approximately twice the value of the recess 614, in this case thirty (30) nanometers.

Because the size of the keyhole 618 is based on the size of the recess 614, and not on lithography creating the other device features, this sub-lithographic-sized feature size enables etching of subsequent layers with features that are smaller than those created using the lithography. Furthermore, the variability of lithographically defined size is not transferred to the size of keyhole 618.

Figure 10:
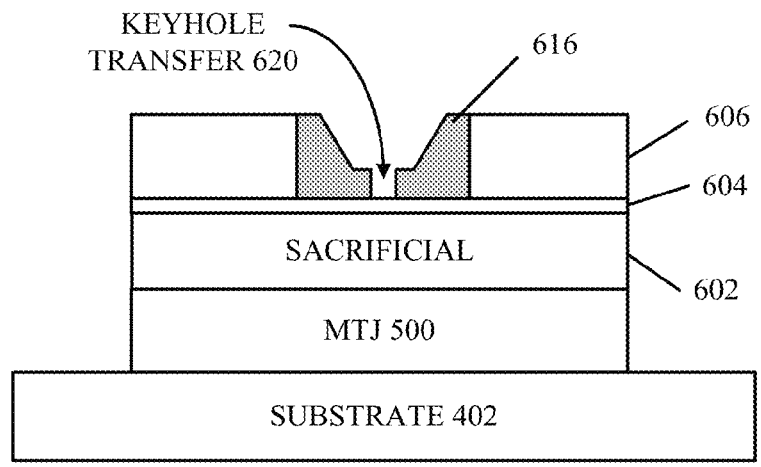

FIG. 10 illustrates removal of the lithographic pattern layer 608 and etching of the keyhole pattern layer 606. As the keyhole pattern layer 606 is etched, and the keyhole 618 is reached, the keyhole size is transferred to the portion of the conformal film 616 proximate the hard mask layer 604. Thus, the size of the keyhole transfer 620 is now available for a mask to etch the hard mask layer 604. A directional etch process may be used.

Figure 11:
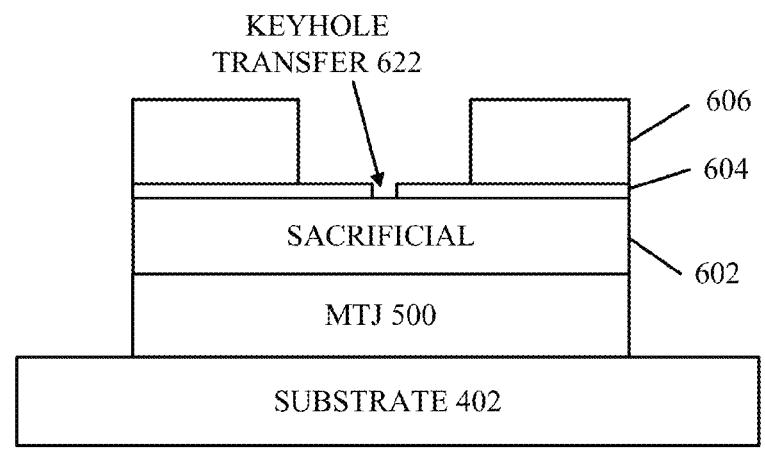

FIG. 11 illustrates the optional step of etching the hard mask layer 604 and removal of the conformal film 616. A selective etch process may be used. A keyhole pattern 622 shown in the hard mask layer 604 may now be a mask to etch the sacrificial layer 602. If the sacrificial layer 602 is not used in the patterning stack 600, or is part of the hard mask layer 604, then the pillar material 624 may be deposited, as shown in FIG. 13.

Figure 12:
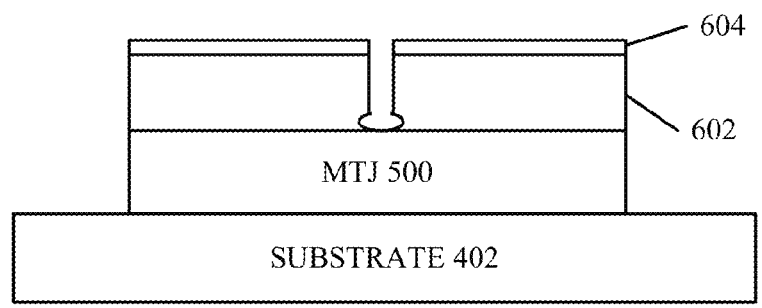

In one configuration, the sacrificial layer 602 is included in the patterning stack 600. In this configuration, the etching of FIG. 12 may be implemented. In particular, FIG. 12 illustrates etching of the keyhole pattern layer 606 and etching of the sacrificial layer 602. The keyhole transfer 622 pattern is transferred to the sacrificial layer 602. In etching narrow, high aspect ratio holes, it is common to have slight bowing at the bottom of the etch. In another configuration, the etch of the sacrificial layer 602 occurs at the same time as the etch of the hard mask layer 604.

Figure 13:
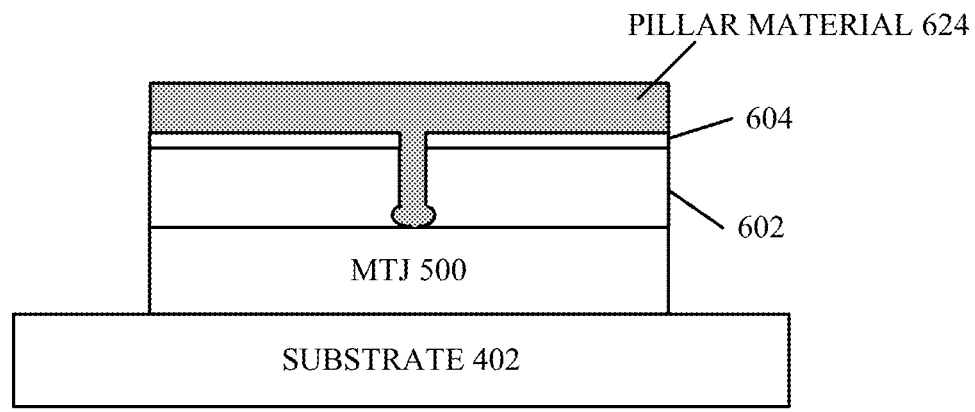
Figure 14:
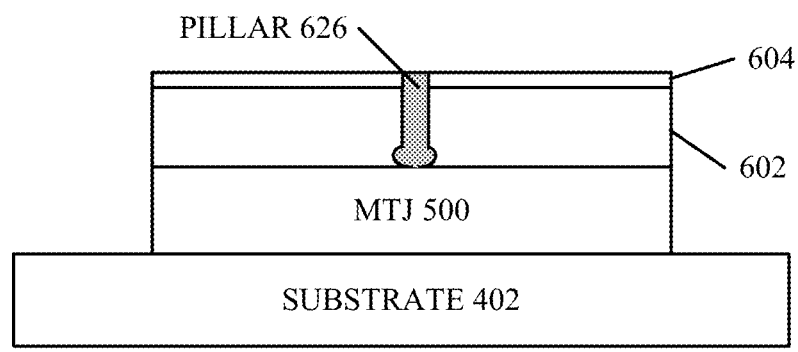

FIG. 13 illustrates depositing of a pillar material 624 onto the hard mask layer 604 and into the transferred keyhole pattern portion of the sacrificial layer 602. The deposition can be a conformal process, such as chemical vapor deposition (CVD), deposition etch cycles, atomic layer deposition (ALD), or plating. The material can be selected based on considerations such as material stress, micro structure, resistance to MTJ etching, and electrical conductivity. FIG. 14 illustrates removal of a portion of the pillar material 624, which may be performed using a chemical mechanical planarization (CMP) process or other planarizing process. The surface of the pillar 626 may be substantially coplanar with the surface of the hard mask layer 604.

Figure 15:
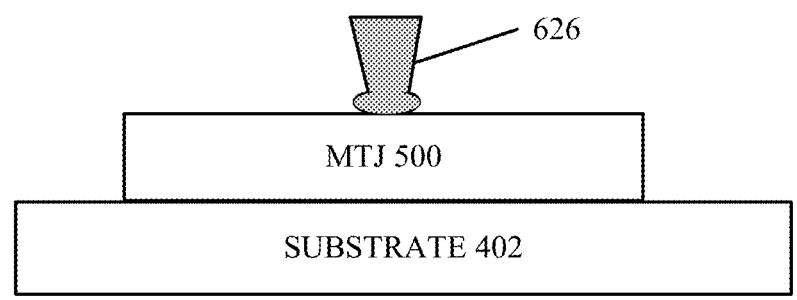

FIG. 15 illustrates removal of the hard mask layer 604 and the sacrificial layer 602, leaving the pillar 626 for a mask to etch the MTJ devices 500. A plasma process can remove the dielectric and expose the MTJ layers.

The present disclosure, through the process described with respect to FIGS. 6-15, improves the critical dimension (CD) uniformity across multiple ones of the MTJ devices 500. The pillar 626, in an aspect of the present disclosure, has a perpendicular surface to the MTJ devices 500, which allows for more precise control of the MTJ device etching at the interface between the pillar 626 and the MTJ devices 500. Further, the present disclosure allows for more flexibility in choosing materials for the pillar 626. The size, uniformity, and smoothness of the outside wall(s) of the pillar 626 are defined by the hard mask layer 604 and/or the sacrificial layer 602, rather than etching the pillar 626 to remove the pillar 626 material. This helps create more uniform pillars 626, and thus more uniform ones of the MTJ devices 500.

Figure 16A:
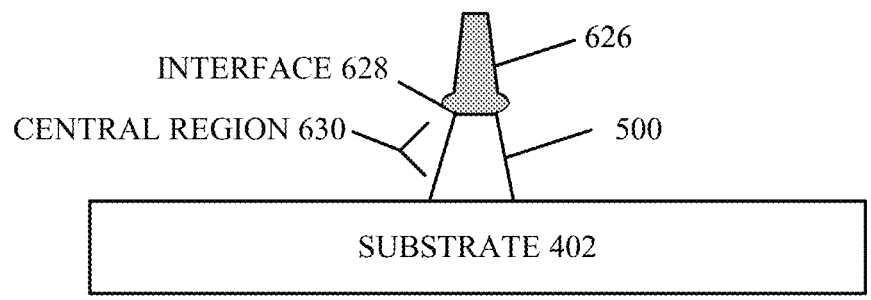
FIGS. 16A-16B illustrate cross-sections of a magnetic tunnel junction in accordance with aspects of the present disclosure.
Figure 16B:
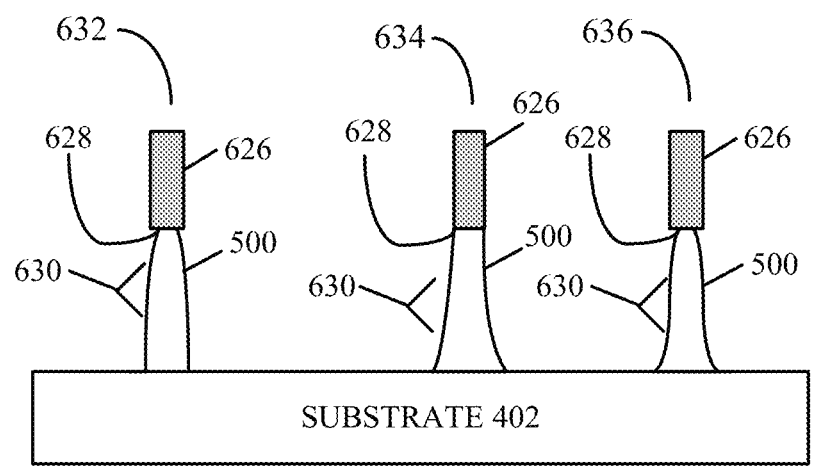

FIGS. 16A-16B illustrate cross-sections of a magnetic tunnel junction in accordance with aspects of the present disclosure. FIG. 16A illustrates etching one of the MTJ devices 500 using the pillar 626. In FIG. 16A, the interface 628 is shown as having a similar cross-section as that of the connected bowed portion of the pillar 626. A central region 630 of the MTJ devices 500 may have an cross-section profile that is similar to that of the interface 628, although, as shown in FIG. 16A, the central region 630 may have a wider cross-section profile because of the shadowing of the pillar 626. Further, the pillar 626 may also be etched, which may result in a cone shape of the pillar 626. Because of the nature of plasma or other types of etching, however, an aspect of the present disclosure enables for an interface 628 between the one of the MTJ devices 500 and the pillar 626 to have a different cross section than other portions of the one of the MTJ devices 500.

FIG. 16B illustrates that the cross section of one of the MTJ devices 500 may have a different cross section than that of the pillar 626. For example, in a pillar 632, a cross section of the interface 628 may be smaller than the cross section at a central region 630 of the MTJ devices 500. The central region 630 of the pillar 632 may be similar to the cross section of the pillar 626. The reduction in the cross section of the interface 628 of the pillar 632 may be due to undercutting of the MTJ devices 500 during the etching of the MTJ devices 500.

In another aspect of the present disclosure, a pillar 634 may be produced, where there is little or no undercutting of the pillar 626 but the etching of the MTJ devices 500 may not be aligned linearly with edges of the pillar 626. Further, one side of the MTJ devices 500 may have a different etching profile than the other. In the example of the pillar 634, the cross section of the central region 630 of the MTJ devices 500 is larger than the cross section of the interface 628. A pillar 636 may also be produced within an aspect of the present disclosure, where there is undercutting of the pillar 626 at the interface 628, and the etching of the MTJ devices 500 may also be misaligned with the pillar 626. Other possibilities having differing cross sectional profiles between the interface 628 and any portion of the MTJ devices 500 are possible within the scope of the present disclosure. Although not shown in FIG. 16B, the cross-sectional profile of the pillar 626 may also be affected during the etching of the MTJ devices 500, which may end up with cross-sectional profiles similar to that shown in FIG. 16A. Other cross-sectional profiles are possible for the pillar 626 within the scope of the present disclosure.

Figure 17:
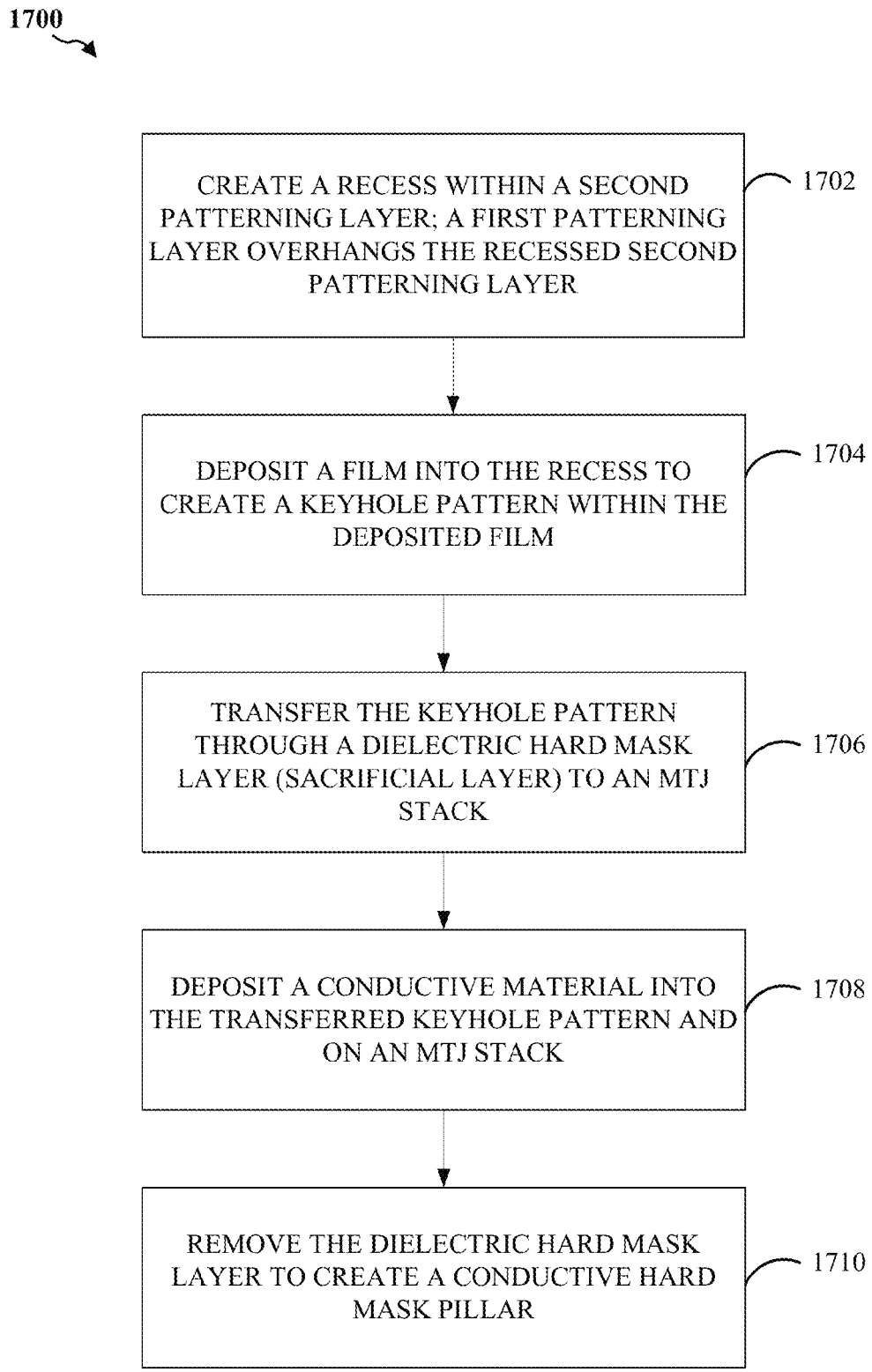
FIG. 17 is a process flow diagram illustrating a process of routing conductive layers within an integrated circuit according to an aspect of the present disclosure.

FIG. 17 is a process flow diagram illustrating a method 1700 for fabricating a magnetic tunneling junction (MTJ) device according to an aspect of the present disclosure. In block 1702 a recess within a second patterning layer is created. A first patterning layer overhangs the recessed second patterning layer. For example, a recess 614 is created as shown in FIG. 8. In block 1704 a film is deposited into the recess to create a keyhole pattern within the deposited film. For example, the conformal film 616 is deposited into the recess as shown in FIG. 9.

In block 1706, the keyhole pattern is transferred through a dielectric hard mask layer to an MTJ stack. For example, the keyhole pattern 620 is transferred to the MTJ devices 500 as shown in FIGS. 10-12. In block 1708, a conductive material is deposited into the transferred keyhole pattern and on an MTJ stack. For example, the pillar material 624 is deposited as shown in FIG. 13. In block 1710, the dielectric hard mask layer is removed to create a conductive hard mask pillar. For example, the hard mask layer 604 is removed as shown in FIGS. 14 and 15 to create the pillar 626.

In an aspect of the present disclosure, a magnetic tunnel junction (MTJ) array includes a plurality of MTJ stacks. In such an aspect, the MTJ array also includes means for conducting, the conducting means being electrically coupled to a corresponding one of the MTJ stacks. The conducting means includes an interface with the corresponding one of the MTJ stacks that has a smaller cross section than a cross section of a central region of the corresponding one of the MTJ stacks. The conducting means may be the pillar 626 as shown in FIGS. 16A-16B. In another aspect, the aforementioned means may be any module or any apparatus configured to perform the functions recited by the aforementioned means.

Figure 18:
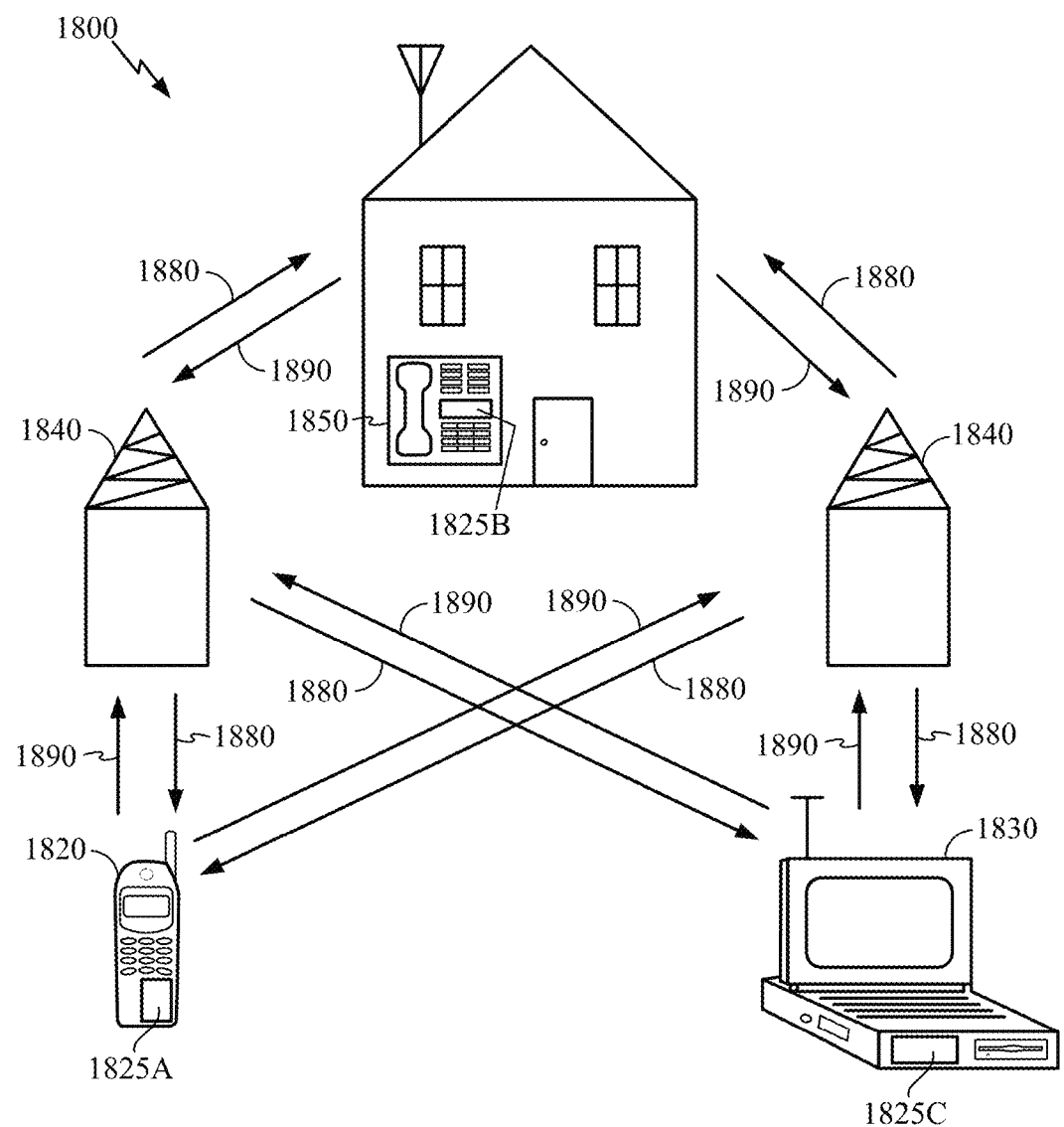
FIG. 18 is a block diagram showing an exemplary wireless communication system in which a configuration of the disclosure may be advantageously employed.

FIG. 18 is a block diagram showing an exemplary wireless communication system 1800 in which an aspect of the disclosure may be advantageously employed. For purposes of illustration, FIG. 18 shows three remote units 1820, 1830, and 1850 and two base stations 1840. It will be recognized that wireless communication systems may have many more remote units and base stations. Remote units 1820, 1830, and 1850 include IC devices 1825A, 1825C, and 1825B that include the disclosed devices. It will be recognized that other devices may also include the disclosed devices, such as the base stations, switching devices, and network equipment. FIG. 18 shows forward link signals 1880 from the base station 1840 to the remote units 1820, 1830, and 1850 and reverse link signals 1890 from the remote units 1820, 1830, and 1850 to base stations 1840.

In FIG. 18, remote unit 1820 is shown as a mobile telephone, remote unit 1830 is shown as a portable computer, and remote unit 1850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 18 illustrates remote units according to the aspects of the disclosure, the disclosure is not limited to these exemplary illustrated units. Aspects of the disclosure may be suitably employed in many devices, which include the disclosed devices.

Figure 19:
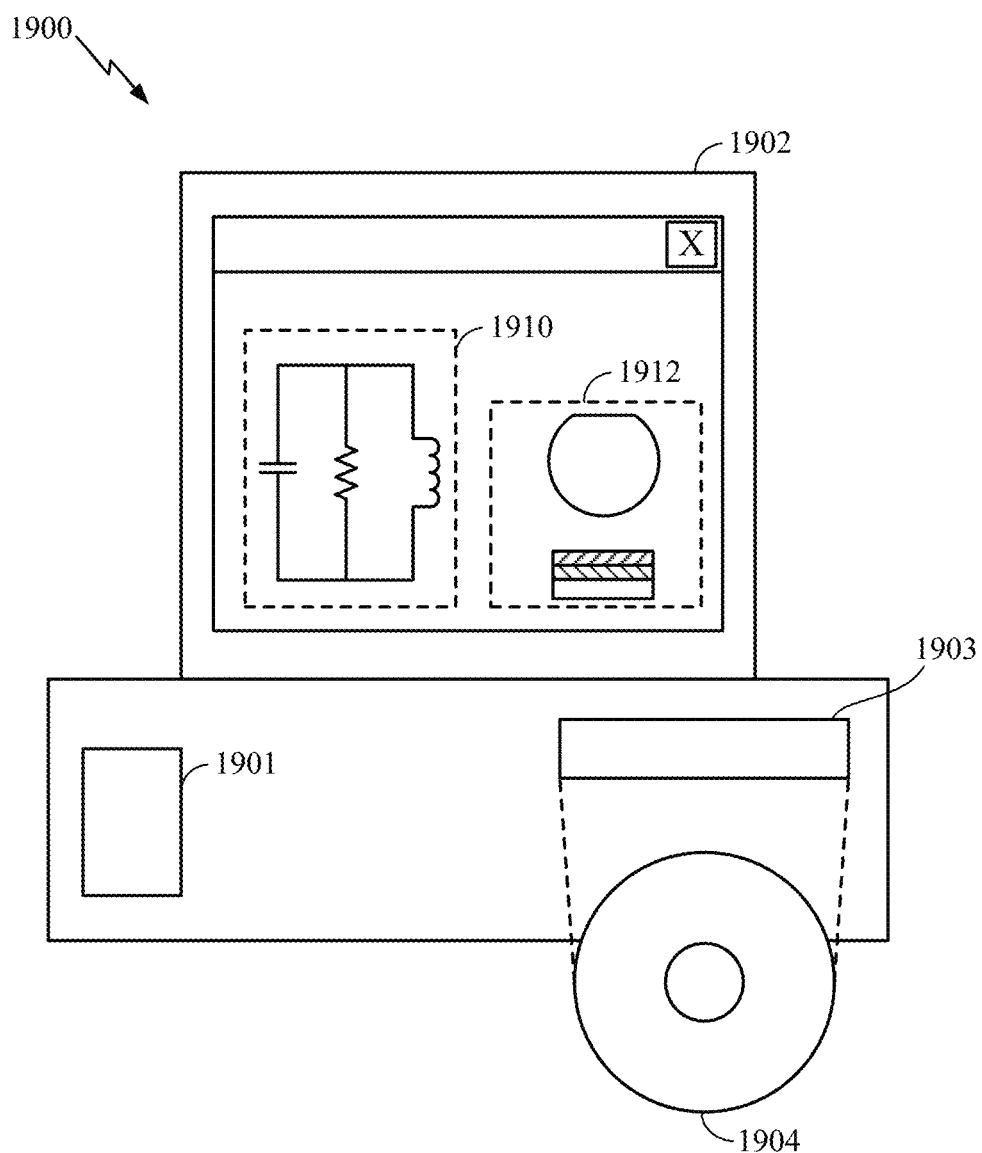
FIG. 19 is a block diagram illustrating a design workstation used for circuit, layout, and logic design of a semiconductor component according to one configuration.

FIG. 19 is a block diagram illustrating a design workstation used for circuit, layout, and logic design of a semiconductor component, such as the devices disclosed above. A design workstation 1900 includes a hard disk 1901 containing operating system software, support files, and design software such as Cadence or OrCAD. The design workstation 1900 also includes a display 1902 to facilitate design of a circuit 1910 or a semiconductor component 1912 such as a device in accordance with an aspect of the present disclosure. A storage medium 1904 is provided for tangibly storing the design of the circuit 1910 or the semiconductor component 1912. The design of the circuit 1910 or the semiconductor component 1912 may be stored on the storage medium 1904 in a file format such as GDSII or GERBER. The storage medium 1904 may be a CD-ROM, DVD, hard disk, flash memory, or other appropriate device. Furthermore, the design workstation 1900 includes a drive apparatus 1903 for accepting input from or writing output to the storage medium 1904.

Data recorded on the storage medium 1904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1904 facilitates the design of the circuit 1910 or the semiconductor component 1912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for fabricating a magnetic tunnel junction (MTJ) device, comprising:
    creating a recess within a second patterning layer, in which a first patterning layer overhangs the recessed second patterning layer;
    depositing a film into the recess to create a keyhole pattern within the deposited film;
    transferring the keyhole pattern through a hard mask layer to an MTJ stack;
    depositing a conductive material into the transferred keyhole pattern and on the MTJ stack; and
    removing the hard mask layer to create a conductive hard mask pillar.

2. The method of claim 1, further comprising etching the MTJ stack based at least in part on the conductive hard mask pillar.

3. The method of claim 1, in which a size of the keyhole pattern corresponds to a size of the recess.

4. The method of claim 1, in which depositing the film into the recess comprises conformally depositing the film into the recess.

5. The method of claim 1, in which a thickness of the hard mask layer corresponds to a height of the conductive hard mask pillar.

6. The method of claim 1, in which creating the recess comprises etching the second patterning layer with an isotropic etch.

7. The method of claim 1, in which the hard mask layer further comprises a sacrificial layer.

8. The method of claim 1, further comprising integrating the MTJ device into a mobile phone, a set top box, a music player, a video player, an entertainment unit, a navigation device, a computer, a hand-held personal communication systems (PCS) unit, a portable data unit, and/or a fixed location data unit.

9. A computer program product for fabricating a magnetic tunnel junction (MTJ) array, comprising:
    a non-transitory computer readable medium having encoded thereon program code, the program code comprising:
        program code to create a recess within a second patterning layer, in which a first patterning layer overhangs the recessed second patterning layer;
        program code to deposit a film into the recess to create a keyhole pattern within the deposited film;
        program code to transfer the keyhole pattern through a hard mask layer to an MTJ stack;
        program code to depositing a conductive material into the transferred keyhole pattern and on the MTJ stack; and
        removing the hard mask layer to create a conductive hard mask pillar.

10. The computer program product of claim 9, further comprising program code to etch the MTJ stack based at least in part on the conductive hard mask pillar.

11. The computer program product of claim 9, in which a size of the keyhole pattern corresponds to a size of the recess.

12. The computer program product of claim 9, in which program code to deposit the film into the recess comprises program code to conformally deposit the film into the recess.

13. The computer program product of claim 9, in which a thickness of the hard mask layer corresponds to a height of the conductive hard mask pillar.

14. The computer program product claim 9, in which the program code to create the recess comprises program code to etch the second patterning layer with an isotropic etch.

15. The computer program product of claim 9, in which the hard mask layer further comprises a sacrificial layer.

16. The computer program product of claim 9, in which the MTJ array is integrated into a mobile phone, a set top box, a music player, a video player, an entertainment unit, a navigation device, a computer, a hand-held personal communication systems (PCS) unit, a portable data unit, and/or a fixed location data unit.

* * * * *